United States Patent
Tseng et al.

(10) Patent No.: US 10,181,560 B2
(45) Date of Patent: Jan. 15, 2019

(54) CONDUCTIVE-BRIDGING RANDOM ACCESS MEMORY AND METHOD FOR FABRICATING THE SAME

(71) Applicant: Winbond Electronics Corp., Taichung (TW)

(72) Inventors: Tseung-Yuen Tseng, Hsinchu (TW); Chun-An Lin, Kaohsiung (TW); Chu-Jie Huang, Tainan (TW); Guang-Jyun Dai, Taoyuan (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/868,351

(22) Filed: Jan. 11, 2018

(65) Prior Publication Data

US 2018/0212143 A1 Jul. 26, 2018

(30) Foreign Application Priority Data

Jan. 25, 2017 (TW) .............................. 106102866 A (51) Int. Cl.
*H01L 29/861* (2006.01)
*H01L 29/18* (2006.01)
*H01L 45/00* (2006.01)
*H01L 21/06* (2006.01)

(52) U.S. Cl.
CPC ........ *H01L 45/085* (2013.01); *H01L 45/1233* (2013.01); *H01L 45/1266* (2013.01); *H01L 45/16* (2013.01); *H01L 45/1608* (2013.01)

(58) Field of Classification Search
CPC ............... H01L 45/085; H01L 45/1233; H01L 45/1266; H01L 45/1608; H01L 45/16

USPC ........... 257/1, 2, 3, 4, 5, E29.087, E27.103, 257/E21.068, E21.409, E45.002, E45.003, 257/E47.001; 365/148; 438/296, 102, 438/382, 95, 3

See application file for complete search history.

(56) References Cited

U.S. PATENT DOCUMENTS

| 8,134,139 B2 * | 3/2012 | Lin ...................... H01L 45/085 257/2 |
| 8,698,119 B2 * | 4/2014 | Tendulkar ........... H01L 45/1608 257/4 |
| 8,866,122 B1 | 10/2014 | Lee et al. |
| 9,305,644 B2 | 4/2016 | Kellam et al. |

(Continued)

FOREIGN PATENT DOCUMENTS

| TW | 201517338 A | 5/2015 |
| TW | 201616701 A | 5/2016 |

*Primary Examiner* — Dao H Nguyen
(74) *Attorney, Agent, or Firm* — Muncy, Geissler, Olds & Lowe, P.C.

(57) ABSTRACT

A conductive-bridging random access memory and a method for fabricating a conductive-bridging random access memory are provided. The conductive-bridging random access memory includes a bottom electrode layer on a semiconductor substrate, an electrical resistance switching layer on the bottom electrode layer, an electron-capturing layer on the electrical resistance switching layer, a barrier layer on the electron-capturing layer, an ion source layer on the barrier layer, and a top electrode layer on the ion source layer. The electron-capturing layer includes electron-capturing material, and the electron affinity of the electron-capturing material is at least 60 KJ/mole.

17 Claims, 6 Drawing Sheets

(56) References Cited

U.S. PATENT DOCUMENTS

| | | | |
|---|---|---|---|
| 2007/0148882 A1* | 6/2007 | Dressler | G11C 13/0011 |
| | | | 438/296 |
| 2013/0056700 A1* | 3/2013 | Wang | H01L 45/08 |
| | | | 257/4 |
| 2014/0131653 A1* | 5/2014 | Lee | G11C 11/00 |
| | | | 257/4 |
| 2014/0191182 A1 | 7/2014 | Yasuda et al. | |
| 2014/0192589 A1 | 7/2014 | Maxwell et al. | |
| 2014/0203235 A1* | 7/2014 | Lee | H01L 45/1608 |
| | | | 257/3 |
| 2014/0246641 A1 | 9/2014 | Jameson, III et al. | |
| 2015/0069318 A1* | 3/2015 | Arayashiki | H01L 45/085 |
| | | | 257/4 |
| 2015/0078065 A1 | 3/2015 | Vianello et al. | |

\* cited by examiner

CONDUCTIVE-BRIDGING RANDOM ACCESS MEMORY AND METHOD FOR FABRICATING THE SAME

CROSS REFERENCE TO RELATED APPLICATIONS

This Application claims priority of Taiwan Patent Application No. 106102866, filed on Jan. 25, 2017, the entirety of which is incorporated by reference herein.

BACKGROUND

Field of the Disclosure

The present disclosure relates to a memory device, and in particular it relates to a conductive-bridging random access memory and a method for fabricating a conductive-bridging random access memory.

Description of the Related Art

The resistive random access memory (RRAM) has the advantages of having a simple structure, a small area, a low operating voltage, a fast operating speed, a long memory period, a capability of storing in single state and multi-states, and low power consumption. Therefore, the resistive random access memory has great potential to replace the flash memory as the mainstream of the next generation of non-volatile memory.

Among the types of resistive random access memory, the conductive-bridging random access memory (CBRAM) has low-power consumption, is customizable, and is a CMOS-compatible memory. Furthermore, the conductive-bridging random access memory is functionally similar to the electrically erasable programmable read-only memory (EEPROM), but the conductive-bridging random access memory has a smaller size and a lower manufacturing cost. Because of the above advantages, the development potential of conductive-bridging random access memory is highly expected.

However, the existing conductive-bridging random access memory is still unable to fully meet all requirements in terms of stability and endurance during high-temperature operations. Therefore, there is still a need to improve the conductive-bridging random access memory.

BRIEF SUMMARY

The disclosure provides a conductive-bridging random access memory. The conductive-bridging random access memory includes a bottom electrode layer on a semiconductor substrate, an electrical resistance switching layer on the bottom electrode layer, an electron-capturing layer on the electrical resistance switching layer, a barrier layer on the electron-capturing layer, an ion source layer on the barrier layer, and a top electrode layer on the ion source layer. The electron-capturing layer includes an electron-capturing material, and the electron affinity of the electron-capturing material is at least 60 KJ/mole.

The disclosure also provides a method for fabricating a resistive random-access memory structure. The method includes forming a bottom electrode layer on the semiconductor substrate, forming an electrical resistance switching layer on the bottom electrode layer, forming an electron-capturing layer on the electrical resistance switching layer, forming a barrier layer on the electron-capturing layer, forming an ion source layer on the barrier layer, and forming a top electrode layer on the ion source layer. The electron-capturing layer includes an electron-capturing material, and the electron affinity of the electron-capturing material is at least 60 KJ/mole.

A detailed description is given in the following embodiments with reference to the accompanying drawings.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

In the disclosure, the term "about" or "approximately" means in a range of 20% of a given value or range, preferably 10%, and more preferably 5%. In the disclosure, if there is no specific explanation, a given value or range means an approximate value which may imply the meaning of "about" or "approximately".

In the disclosure, the unit "%" of the indicated content is "atomic percentage (atom %)". For example, if the content of the X component is 10% and the content of the Y component is 90% in a material or structure, it means that there are 10 X atoms and 90 Y atoms per 100 atoms in the material or structure.

The ion source element may include a metal or a metal metalloid. For the sake of simplicity of description, the positively charged ions made from the ion source element are hereinafter referred to as "metal ions". Similarly, the atoms made from the combination of these "metal ions" and electrons are hereinafter referred to as "metal atoms".

Figure 1:
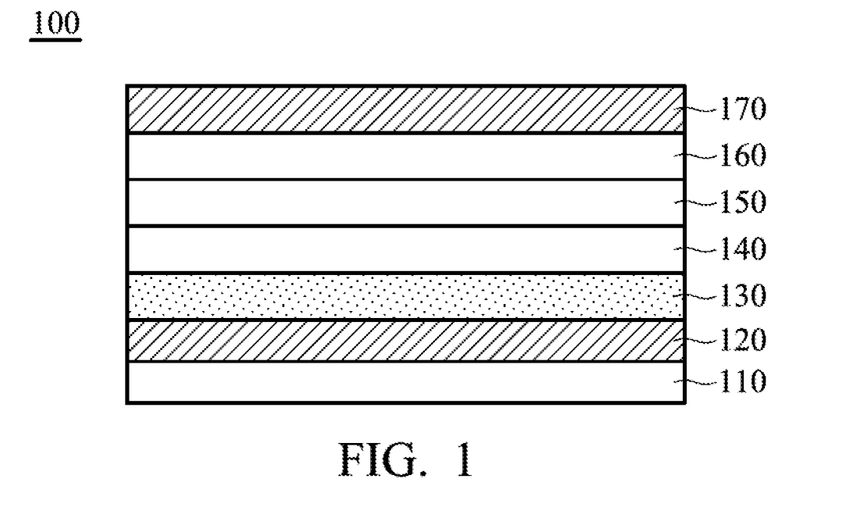
FIG. 1 shows a cross-sectional view of a conductive-bridging random access memory in accordance with some embodiments.

In some embodiments of the disclosure, a conductive-bridging random access memory and a method for fabricating the conductive-bridging random access memory are provided. FIG. 1 shows a cross-sectional view of a conductive-bridging random access memory 100 in accordance with some embodiments.

Referring to FIG. 1, the conductive-bridging random access memory 100 includes a bottom electrode layer 120, an electrical resistance switching layer 130, an electron-capturing layer 140, a barrier layer 150, an ion source layer 160, a top electrode layer 170 sequentially formed on a semiconductor substrate 110. A detailed description of the method for fabricating the conductive-bridging random access memory 100 and the function or property of each component is given with reference to FIG. 1.

Referring to FIG. 1, a semiconductor substrate 110 is provided. The semiconductor substrate 110 may include a bulk semiconductor substrate (such as silicon substrate), a compound semiconductor substrate (such as a group IIIA-VA semiconductor substrate), a silicon-on-insulator (SOI) substrate, or another applicable substrate. In this embodiment, the semiconductor substrate 110 is a silicon substrate. The semiconductor substrate 110 may be a doped semiconductor substrate or an undoped semiconductor substrate. In some embodiments, the semiconductor substrate 110 may further include: a gate structure including silicon and metal layer, a plug contact landing structure including polysilicon and epitaxial silicon, other applicable silicon-containing structures, or a combination thereof. In other embodiments, the semiconductor substrate 110 may include a multilayer interconnect structure formed from metal layers and dielectric layers, a redistribution layer, other electrical connection structures, or a combination thereof.

Then, a bottom electrode layer 120 is formed on the semiconductor substrate 110. The bottom electrode layer 120 and the subsequently formed top electrode layer 170 may be used for applying voltage to the conductive-bridging random access memory 100 which may be switched to different electrical resistance states. The bottom electrode layer 120 may include any applicable conductive material. In some embodiments, the bottom electrode layer 120 may be an inert metal or alloy, such as titanium, platinum, aluminum, tungsten, iridium, ruthenium, tantalum, nickel, molybdenum, zirconium, another suitable inert metal, or a combination thereof. In other embodiments, the bottom electrode layer 120 may be a conductive oxide, a conductive nitride and/or a conductive silicide, such as iridium oxide, indium tin oxide, tungsten oxide, titanium oxide, titanium nitride, tantalum nitride, tungsten silicide, or another suitable material. In other embodiments, the bottom electrode layer 120 may be a conductive polymer.

If the bottom electrode layer 120 includes the element (such as copper, silver, gold, or tellurium) which may be used as an ion source, an unexpected or undesired diffusion may occur when the low-electrical-resistance state (LRS) is switched to the high-electrical-resistance state (HRS). Therefore, the ion source element may diffuse from the bottom electrode layer 120 into the electrical resistance switching layer 130. As a result, the electrical resistance value of the high-electrical-resistance state may be decreased, and an error during operation of the device may occur. In order to avoid the aforementioned error, the bottom electrode layer 120 may be formed by selecting a material which does not substantially include the ion source element.

Furthermore, in some embodiments, the electrical connection structures of the semiconductor substrate 110 may contain or be made of the ion source element (such as copper). In such embodiments, if the bottom electrode layer 120 is in direct contact with these electrical connection structures, the ion source element may diffuse into the electrical resistance switching layer 130 through the bottom electrode layer 120. Therefore, the aforementioned error may occur. In order to prevent the aforementioned error, in such embodiments, before the bottom electrode layer 120 is formed, a diffusion barrier layer (not shown) may be formed on the surface of the electrical connection structures. The diffusion barrier layer may include suitable conductive material, such as tantalum nitride, titanium nitride, tungsten nitride, or another suitable material.

The bottom electrode layer 120 may be formed by suitable processes, such as a sputtering process, an atomic layer deposition (ALD) process, a chemical vapor deposition (CVD) process, an evaporation process, or a combination thereof. If the thickness of the bottom electrode layer 120 is too thin, the bottom electrode layer 120 cannot be used for applying voltage due to its poor conductivity. On the other hand, if the thickness of the bottom electrode layer 120 is too thick, it is disadvantageous in the miniaturization of the device, and the cost may be increased. In some embodiments, the thickness of the bottom electrode layer 120 may be in a range of 1-1000 nm. In other embodiments, the thickness of the bottom electrode layer 120 may be in a range of 2-500 nm. For example, the thickness of the bottom electrode layer 120 may be 5 nm. In other embodiments, the thickness of the bottom electrode layer 120 may be in a range of 10-200 nm.

Then, an electrical resistance switching layer 130 is formed on the bottom electrode layer 120, as shown in FIG. 1. The electrical resistance states of the conductive-bridging random access memory 100 may be switched by adopting the electrical resistance switching layer 130.

The mechanism of the switching process between the different electrical resistance states of the conductive-bridging random access memory is described herein. Since the electrical resistance switching layer is made of a dielectric material or an insulating material having a high electrical resistance value, the conductive-bridging random access memory is in a high-electrical-resistance state when no voltage is applied. When an operating voltage (or writing voltage) is applied, the ion source elements (metal or met-alloid, such as copper, silver, gold, or tellurium, etc.) of the ion source layer are urged to carry out the redox reaction and the positively charged metal ions are produced. The operating voltage drives these metal ions to move from the ion source layer toward the electrical resistance switching layer. When these metal ions move to the junction of the electrical resistance switching layer and the bottom electrode layer, these metal ions are combined with electrons and reduced to be metal atoms having good conductivity. These metal atoms are aggregated and connected to each other to form conductive paths, such as conductive bridges or conductive filaments. Therefore, the electrical resistance value of the electrical resistance switching layer is decreased. As a result, the conductive-bridging random access memory is switched from the high-resistance-state to the low-resistance-state.

Then, when a reversed voltage (or erasing voltage) is applied, the metal atoms in the conductive paths lose electrons and become positively charged metal ions. The reversed voltage drives these metal ions to move toward the ion source layer and to leave the electrical resistance switching layer. Therefore, the conductive paths are fractured, and the electrical resistance value of the electrical resistance switching layer is increased. As a result, the conductive-bridging random access memory is switched from the lowresistance-state to the high-resistance-state. The saving and reading of the data is performed by the aforementioned switching of the electrical resistance states, and therefore, the memory function of the conductive-bridging random access memory is achieved.

The electrical resistance switching layer 130 may be made of suitable dielectric material or insulating material, such as oxide, nitride, oxynitride, another suitable high dielectric constant (high-k) material, or a combination thereof. In some embodiments, the electrical resistance switching layer 130 may include an oxide, a nitride or an oxynitride of a Group IA or Group IIA metal. In other embodiments, the resistive transducing layer 130 may include a nitride or an oxynitride of a transition metal. For example, the transition metals may include: scandium, yttrium, titanium, zirconium, hafnium, vanadium, niobium, tantalum, chromium, molybdenum, tungsten, manganese, iron, cobalt, rhenium, nickel, other suitable transition metal, or combinations therefore.

If the electrical resistance switching layer 130 includes the element (such as copper, silver, gold, or tellurium) which may be used as an ion source, the ion source elements may remain in the electrical resistance switching layer 130 when the low-resistance-state is switched to the high-resistance-state. Therefore, the conductive paths may not be fractured. As a result, the electrical resistance value of the high-electrical-resistance state may be decreased, and an error during operation of the device may occur. In order to avoid the aforementioned error, the electrical resistance switching layer 130 may be made from the material which does not substantially include the ion source element.

The electrical resistance switching layer 130 may be formed by suitable processes, such as a sputtering process, an atomic layer deposition process, a chemical vapor deposition process, an evaporation process, a high-temperature furnace process, or a combination thereof.

If the thickness of the electrical resistance switching layer 130 is too thin, it is likely to cause erroneous operation because the resistance value of the high-electrical-resistance state is too low. On the other hand, if the thickness of the electrical resistance switching layer 130 is too thick, the conductive paths may not formed easily. Therefore, it is disadvantageous for the conductive-bridging random access memory to be switched from the high-electrical-resistance state to the low-electrical-resistance state. In some embodiments, the thickness of the electrical resistance switching layer 130 is in a range of 1-1000 nm. In other embodiments, the thickness of the electrical resistance switching layer 130 is in a range of 2-500 nm. In other embodiments, the thickness of the electrical resistance switching layer 130 is in a range of 5-300 nm.

Then, an electron-capturing layer 140 is formed on the electrical resistance switching layer 130, as shown in FIG. 1. The electron-capturing layer 140 may compete against the positively charged metal ions made from the ion source element in capturing electrons. In other words, if more electrons are combined with the electron-capturing layer 140, fewer electrons are combined with the metal ions of the ion source element. As a result, the stability and endurance of the device at high-temperature operations are improved. The details will be discussed in the following paragraphs.

Then, a barrier layer 150 is formed on the electron-capturing layer 140, as shown in FIG. 1. In the high-electrical-resistance state, the diffusion of the metal ions of the ion source element may be blocked by the barrier layer 150, and the formation of undesired conductive paths in the electrical resistance switching layer 130 may be avoided. As a result, the stability and endurance of the device at high-temperature operations are improved. The details will be discussed in the following paragraphs.

Then, an ion source layer 160 is formed on the barrier layer 150, as shown in FIG. 1. When the high-electrical-resistance state is switched to the low-electrical-resistance state, the ion source layer 160 may provide the ion source element, and the metal ions made from the ion source element may move into the electrical resistance switching layer 130. As a result, the aforementioned switching process between the different electrical resistance states is accomplished.

The ion source layer 160 may include an ion source element. When the forming voltage (or writing voltage) is applied, the ion source element may be oxidized to form positively charged ions. Therefore, the ion source layer 160 may release metal ions into the electrical resistance switching layer 130. In some embodiments, the ion source element may include metal (such as copper, silver, or gold), a metalloid (such as tellurium), alloys thereof, or a combination thereof.

Besides the ion source element, the ion source layer 160 may include a conductive element which is different from the ion source element. Even if the forming voltage (or writing voltage) is applied, the conductive element will not be oxidized to be a positively charged ion. Therefore, the conductive element is not the ion source element, and it cannot provide the metal ions as the ion source. The conductive element may increase the adhesion between the ion source layer 160 and the barrier layer 150, and thus, delamination may be avoided. Furthermore, the conductive element may increase the conductivity of the ion source layer 160, and the operating voltage may be decreased. In some embodiments, the conductive element may include titanium, tungsten, tantalum, or a combination thereof.

In some embodiments, the ion source layer 160 may be the alloy made of the ion source element and the conductive element. For example, in some embodiments, the ion source element may be tellurium, and the material of the ion source layer 160 may be titanium tellurium alloy, tungsten tellurium alloy, titanium tungsten tellurium alloy, tantalum tellurium alloy, tantalum tungsten tellurium alloy, or a combination thereof.

When the ion source layer is the alloy made of the ion source element and the conductive element, the content of the ion source element in the ion source layer may be controlled within a suitable range. If the content of the ion source element is too low, the metal ions provided by the ion source layer are insufficient to form the desired conductive paths. Therefore, it is disadvantageous for the conductive-bridging random access memory to be switched from the high-electrical-resistance state to the low-electrical-resistance state. On the other hand, if the content of the ion source element is too high, the adhesion between the ion source layer and the barrier layer is insufficient, and delamination may occur. Furthermore, if the content of the ion source element is too high, the metal ions made from the ion source element are too numerous. Therefore, in order to improve the stability and endurance of the device at high-temperature operations, a thicker barrier layer and a thicker electron-capturing layer are necessary. As a result, it is disadvantageous for the miniaturization of the device.

In some embodiments, the content of the ion source element in the ion source layer 160 is in a range of 10%-90%. In other embodiments, the content of the ion source element in the ion source layer 160 is in a range of 10%-70%. In other embodiments, the content of the ion source element in the ion source layer 160 is not greater than 50%. In other embodiments, the content of the ion source element in the ion source layer 160 is in a range of 15%-50%. In other embodiments, the content of the ion source element in the ion source layer 160 is in a range of 25%-40%.

The ion source layer 160 may be formed by suitable processes, such as a sputtering process, an atomic layer deposition process, a chemical vapor deposition process, an evaporation process, or a combination thereof. In some embodiments, the ion source layer 160 may be formed by a sputtering process in which an alloy target having the specific ratio of ion source element to conductive element is used. Therefore, the ion source layer 160 may be formed by performing the deposition process once. As a result, the manufacturing process may be simplified, and productivity may be increased.

In other embodiments, two deposition processes may be performed for respectively depositing a pure ion source element and a pure conductive element. Then, an annealing process may be performed so that the ion source element may form an alloy with the conductive element, and the ion source layer 160 may be formed. In such embodiments, the ion source element may be deposited first, or the conductive element may be deposited first. As a result, the content of the ion source element in the ion source layer 160 may easily be adjusted to any desired amount, and the flexibility of the process and the product may improve.

Then, a top electrode layer 170 is formed on the ion source layer 160, as shown in FIG. 1.

If the top electrode layer 170 is made of an element which may be used as an ion source, there may be too many metal ions made from the ion source element when the high-resistance-state is switched to the low-resistance-state. Therefore, in order to improve the stability and endurance of the device at high-temperature operations, thicker barrier layer and thicker electron-capturing layer are necessary. As a result, it is disadvantageous for the miniaturization of the device. Furthermore, if the barrier layer and the electron-capturing layer are too thick, the forming voltage (or writing voltage) may be too large. As a result, it is disadvantageous in decreasing energy consumption and improving the endurance of the device. In order to avoid the aforementioned problems, in some embodiments, the top electrode layer 170 may be made from the material which does not substantially include the ion source element. In such embodiments, the function, material, thickness, and formation method of the top electrode layer 170 may be the same as or similar to those of the bottom electrode layer 120, and the details will not be repeated here.

In other embodiments, the content of the ion source element in the ion source layer 160 may be lower (for example, smaller than or equal to 40%), and the metal ions made from the ion source element may not be too much. As a result, the aforementioned problems may be avoided, and the ion source layer 160 may has good conductivity. Therefore, in such embodiments, the top electrode layer 170 may be optionally omitted.

When the high-resistance-state is first switched to the low-resistance-state, the applied voltage is called the forming voltage. After the forming voltage is applied, a reverse voltage which has an absolute value smaller than the absolute value of the forming voltage is applied. Since the absolute value of the reverse voltage is smaller than the absolute value of the forming voltage, the electric field intensity generated by the reverse voltage is smaller than the electric field intensity generated by the forming voltage. Because the intensity of the driving force generated by the reverse voltage is insufficient, the metal ions made from the ion source element may not completely return to the ion source layer. In other words, most of the metal ions remain at the interface between the electrical resistance switching layer and the layer above it. In this way, it is sufficient to switch the high-resistance-state to the low-resistance-state again by applying a writing voltage smaller than the forming voltage.

Even if the writing voltage is not applied, the metal ions at the interface between the electrical resistance switching layer and the layer above it may diffuse into the electrical resistance switching layer when the environment (such as a high-temperature environment) provides sufficient energy. These metal ions are combined with electrons, and unexpected conductive paths are formed. Because of these unexpected conductive paths, the electrical resistance value of the high-electrical-resistance state may be decreased, and an error during operation of the device may occur. Therefore, the stability and endurance of the conductive-bridging random access memory in high-temperature operations are poor.

The inventors of this disclosure discovered that the formation of the unexpected conductive paths in the high-electrical-resistance state may be significantly decreased if a dual-layer structure which has an electron-capturing layer and a barrier layer is formed between the electrical resistance switching layer and the ion source layer. Therefore, the stability and endurance of the conductive-bridging random access memory at high-temperature operations are significantly improved.

The functions of the electron-capturing layer and the barrier layer in the dual-layer structure may be deduced in the following paragraphs. The barrier layer may block the diffusion of the ion source element, and therefore, the ion source element moving from the ion source layer into the electrical resistance switching layer may be significantly decreased. On the other hand, the electron-capturing layer may compete against the positively charged metal ions made from the ion source element in capturing electrons. Therefore, the metal atoms made from electrons combined with the metal ions at the aforementioned interface may be significantly decreased. Thus, the unexpected conductive paths formed in the electrical resistance switching layer may be significantly decreased or completely avoided. As a result, the stability and endurance of the conductive-bridging random access memory at high-temperature operations are significantly improved.

Furthermore, the inventors of this disclosure discovered that the electron affinity of the electron-capturing layer is an important parameter that affects the performance of the conductive-bridging random access memory. In addition, the relative position, material, and thickness of the electron-capturing layer and the barrier layer are also important parameters. The details of these parameters will be discussed in the following paragraphs.

The term "electron affinity" refers to the energy that released when an electron is combined with a substance (which can be an atom, an ion, or a molecule) to form an anion with −1 valence. If a substance has a greater electron affinity, the substance is more easily combined with an electron.

Accordingly, in order to capture electrons effectively, the electron-capturing layer may include electron-capturing material which has high electron affinity. More specifically, the electron affinity of the electron-capturing material is higher than the electron affinity of the positively charged metal ions made from the ion source element. Therefore, the combinations of the electrons and the positively charged metal ions made from the ion source element may be significantly decreased by the electron-capturing layer. As a result, the stability and endurance of the device at high-temperature operations are significantly improved.

If the electron affinity of the electron-capturing material is too low, the combination of the electron-capturing material and the electron may be too weak. Therefore, the stability and endurance of the device in high-temperature operations may not be significantly improved. On the other hand, if the electron affinity of the electron-capturing material is too high, the combination of the electron-capturing material and the electron may be too strong. Therefore, when the high-electrical-resistance state is switched to the low-electrical-resistance state, a higher forming voltage (or writing voltage) is necessary. It is disadvantageous in decreasing energy consumption and improving the endurance of the device.

In some embodiments, the electron affinity of the electron-capturing material is at least 60 KJ/mole. In some embodiments, the electron affinity of the electron-capturing material is not greater than 130 KJ/mole. In other embodiments, the electron affinity of the electron-capturing material is 65-110 KJ/mole. In other embodiments, the electron affinity of the electron-capturing material is 70-90 KJ/mole.

As described above, most of the metal ions remain at the interface between the electrical resistance switching layer and the layer above it. Therefore, in order to capture electrons effectively, the electron-capturing layer may be formed directly on and in direct contact with the electrical resistance switching layer. In addition, if the barrier layer is formed between the electron-capturing layer and the electrical resistance switching layer, the metal ions will be blocked and remain between the barrier layer and the electrical resistance switching layer. As a result, the function of the electron-capturing layer will be reduced. Therefore, the barrier layer is preferably formed between the electron-capturing layer and the ion source layer.

Furthermore, in order to block the diffusion of the ion source element effectively, the electron-capturing layer and the barrier layer may be amorphous material. If the electron-capturing layer and the barrier layer are crystalline material, the ion source element may diffuse into the electrical resistance switching layer along and through the boundary of the grain of the crystalline material. In addition, in order to increase the electrical conductivity of the whole conductive-bridging random access memory, conductive material may be used to form the electron-capturing layer and the barrier layer. If the conductivity of the electron-capturing layer and the barrier layer is poor, the electrical conductivity of the whole conductive-bridging random access memory may be reduced. Therefore, a higher writing voltage and a higher erasing voltage are necessary for operating. It is disadvantageous for the operation of the device, and the device may be degraded. Accordingly, the material of the electron-capturing layer and the barrier layer is preferably amorphous conductive material.

For example, in some embodiments, the electron-capturing material of the electron-capturing layer may be made of a first amorphous material, and the first amorphous material may include a metal, an alloy, a metal doped with nitrogen, oxygen sulfur or silicon, an alloy doped with nitrogen, oxygen sulfur or silicon, or a combination thereof. The barrier layer may be made of a second amorphous material, and the second amorphous material may include a metal, a metal oxide, a metal silicide, a metal nitride, a metal oxynitride, a metal silicide nitride, or a combination thereof. It should be noted that the second amorphous material is different from the first amorphous material because the function of the electron-capturing layer is different from the function of the barrier layer. Therefore, the electron-capturing layer and the barrier layer form a dual-layer structure, rather than a single-layer structure.

More specifically, in some embodiments, the electron-capturing material of the electron-capturing layer 140 may include lithium (Li), chromium (Cr), molybdenum (Mo), tungsten (W), cobalt (Co), or alloys thereof. In other embodiments, the electron-capturing material may be doped, and the doping element may include nitrogen, oxygen, sulfur, silicon, titanium, tantalum, or a combination thereof. In this embodiment, the electron-capturing material is titanium tungsten (TiW) alloy formed by doping titanium into tungsten.

More specifically, in some embodiments, the material of the barrier layer 150 may include titanium, tantalum, titanium alloy, tantalum alloy, titanium oxide, tantalum oxide, titanium nitride, tantalum nitride, titanium oxynitride, tantalum oxynitride, titanium silicide, tantalum silicide, titanium silicide nitride, or tantalum silicide nitride. In this embodiment, the material of the barrier layer 150 is tantalum metal.

The thickness of the electron-capturing layer may be controlled within a specific range. If the electron-capturing layer is too thin, the electron-capturing material may be insufficient to capture electrons. Therefore, it is disadvantageous for avoiding the formation of the undesired conductive paths. On the other hand, if the electron-capturing layer is too thick, the electrical conductivity of the whole CBRAM may be reduced, and it is disadvantageous for the miniaturization of the device.

In some embodiments, the thickness of the electron-capturing layer 140 is in a range of 1-10 nm. In other embodiments, the thickness of the electron-capturing layer 140 is in a range of 2-8 nm. In other embodiments, the thickness of the electron-capturing layer 140 is in a range of 3-6 nm.

In addition, the total thickness of the dual-layer structure formed by the electron-capturing layer and the barrier layer may be controlled to maintain within a specific range. If the total thickness of the dual-layer structure is too thin, the diffusion of the ion source element may not be blocked effectively, and the electrons may not be captured effectively. Therefore, the stability and endurance of the device may not be improved. On the other hand, if the total thickness of the dual-layer structure is too thick, the electrical conductivity of the whole CBRAM may be reduced, and it is disadvantageous for the miniaturization of the device. Furthermore, if the total thickness of the electron-capturing layer and the barrier layer is too thick, the forming voltage (or writing voltage) may be too large. As a result, it is disadvantageous in decreasing energy consumption and improving the endurance of the device.

In order to adjust the total thickness of the dual-layer structure, the thickness of the barrier layer may be controlled within a specific range. In some embodiments, the thickness of the barrier layer may be less than 10 nm. In some embodiments, the total thickness of the electron-capturing layer and the barrier layer is in a range of 5-20 nm. In other embodiments, the total thickness of the electron-capturing layer and the barrier layer is in a range of 8-16 nm. In other embodiments, the total thickness of the electron-capturing layer and the barrier layer is in a range of 10-12 nm.

Figure 2:
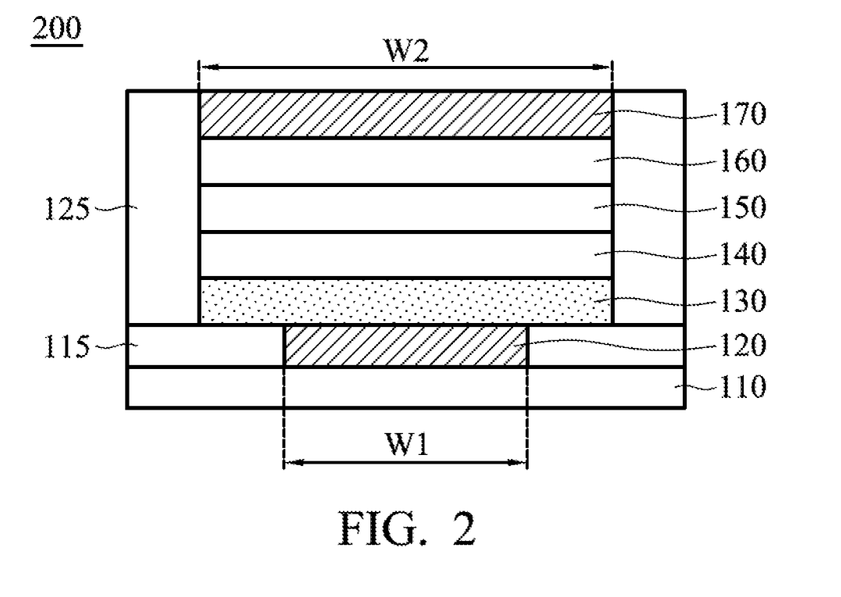
FIG. 2 shows a cross-sectional view of a conductive-bridging random access memory in accordance with other embodiments.

FIG. 2 shows a cross-sectional view of a conductive-bridging random access memory 200 in accordance with other embodiments. Similar reference numbers are used to denote similar elements in FIGS. 1 and 2. For brevity, the same elements and the processing steps as FIG. 1 will not be described again.

Referring to FIG. 2, a first insulating layer 115 is formed on the semiconductor substrate 110, and a first opening is formed in the first insulating layer 115. Then, the bottom electrode layer 120 is formed in the first opening, and the top surfaces of the first insulating layer 115 and the bottom electrode layer 120 are planarized. The first insulating layer 115 may include conventional insulating material, such as an oxide, a nitride, an insulating polymer, or any other suitable insulating material.

Then, a second insulating layer 125 is formed on the first insulating layer 115, and a second opening is formed in the second insulating layer 125. The second insulating layer 125 may include conventional insulating material which may be the same as or different from the material of the first insulating layer 115.

Then, the electrical resistance switching layer 130, the electron-capturing layer 140, the barrier layer 150, the ion source layer 160, and the top electrode layer 170 are sequentially formed in the second opening. Then, the top surfaces of the second insulating layer 125 and the top electrode layer 170 are planarized, and the conductive-bridging random access memory 200 is accomplished.

Referring to FIG. 2, because the width W1 of the bottom electrode layer 120 is smaller than the width W2 of the electrical resistance switching layer 130, the forming position of the conductive paths may be controlled within the position corresponding the bottom electrode layer 120. Therefore, even if some defects exist in the edge of the electrical resistance switching layer 130, the formation of the conductive paths may not be affected. As a result, the yield of product may be improved.

Figure 3:
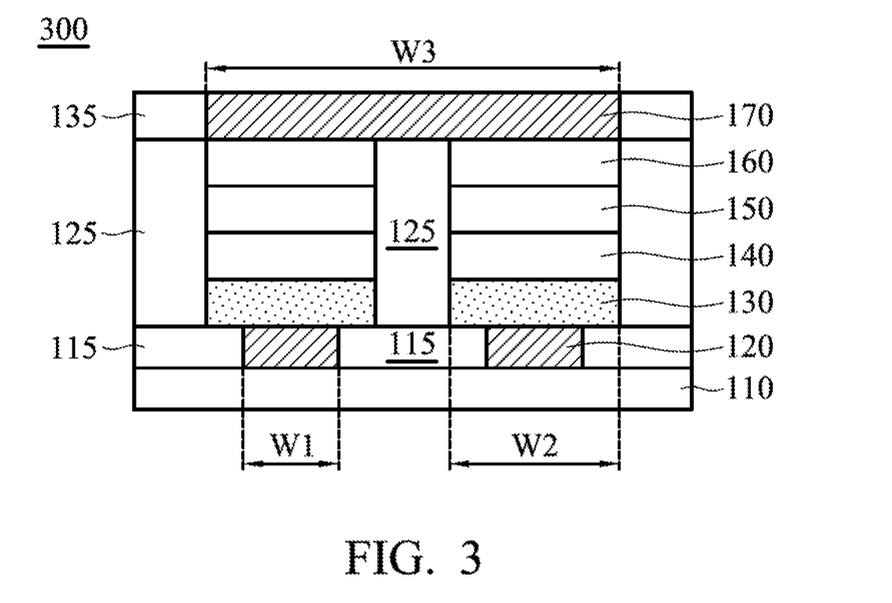
FIG. 3 shows a cross-sectional view of a conductive-bridging random access memory in accordance with another embodiment.

FIG. 3 shows a cross-sectional view of a conductive-bridging random access memory 300 in accordance with another embodiment. Similar reference numbers are used to denote similar elements in FIGS. 1 and 3. For brevity, the same elements and the processing steps as FIG. 1 will not be described again.

Referring to FIG. 3, the bottom electrode layer 120 is formed in the first opening of the first insulating layer 115, and the electrical resistance switching layer 130, the electron-capturing layer 140, the barrier layer 150, and the ion source layer 160 are sequentially formed in the second opening of the second insulating layer 125. Then, a third insulating layer 135 is formed on the second insulating layer 125, and the top electrode layer 170 is formed in the third opening of the third insulating layer 135.

FIG. 3 is similar to FIG. 2, except that the top electrode layer 170 has the largest width W3 which is greater than the width W1 of the bottom electrode layer 120 and the width W2 of the electrical resistance switching layer 130. In such embodiment, two or more conductive-bridging random access memory may be coupled in parallel by one top electrode layer 170. Furthermore, because the width of the top electrode layer 170 is larger, it is advantageous for forming subsequent conductive contacts.

It should be realized that the embodiments are merely examples and are not intended to be limiting. The widths of the bottom electrode layer 120, the electrical resistance switching layer 130, the electron-capturing layer 140, the barrier layer 150, the ion source layer 160, and the top electrode layer 170 may be respectively adjusted according the requirements of the function or manufacturing process.

The experimental data of Comparative Examples and Example are provided below to illustrate the advantages of the conductive-bridging random access memory according to this disclosure.

Comparative Example 1: CBRAM Without the Barrier Layer

Firstly, a cleaning process was performed on a silicon substrate. A high-temperature furnace process was performed to grow a silicon dioxide film (thickness: 200 nm) as the adhesion layer on the silicon substrate. Then, an electron-beam evaporation process was performed to grow a titanium film (thickness: 20 nm) and a platinum layer (thickness: 30 nm) as the conductive layer. Next, an atomic layer deposition process was performed to grow a titanium nitride (TiN) film (thickness: 10 nm) as the bottom electrode layer on the platinum layer. The atomic layer deposition process was performed by using the nitrogen plasma to react with tetrakis(dimethylamino)titanium (TDMAT, $Ti(N(CH_3)_2)_4$) precursor at a temperature of 250° C. and a pressure of 0.3 Torr. Then, an atomic layer deposition process was performed to grow a hafnium dioxide ($HfO_2$) film (thickness: 5 nm) as the electrical resistance switching layer on the titanium nitride film. The atomic layer deposition process was performed by using tetrakis(dimethylamino)hafnium (TDMAH, $Hf(N(CH_3)_2)_4$) as a precursor at a temperature of 250° C. and a pressure of 0.3 Torr. Next, a vacuum sputtering process was performed to grow a titanium tungsten (TiW, Ti:W=12.5%:87.5%) alloy film (thickness: 9 nm) as the electron-capturing layer on the hafnium dioxide film, and to grow a titanium tungsten tellurium (TiWTe, Ti:W:Te=10%:70%:20%) alloy film as the top electrode layer. Finally, a conventional lithography processes and etching processes were performed to define the above formed elements into a cross bar structure (size: 5 μm×5 μm), thus a CBRAM is accomplished.

Comparative Example 2: CBRAM Without the Electron-Capturing Layer

In Comparative Example 2, after growing the hafnium dioxide film as the electrical resistance switching layer, a vacuum sputtering process was performed to grow a tantalum (Ta) metal film (thickness: 9 nm) as the barrier layer instead of the electron-capturing layer. Except for replacing the step of forming the electron-capturing layer with the step of forming the barrier layer, the material and steps in forming all other layers are the same as those of the Comparative Example 1, and the details will not be repeated here.

Example 1: CBRAM with the Barrier Layer and the Electron-Capturing Layer

In Example 1, after growing the hafnium dioxide film as the electrical resistance switching layer, a vacuum sputtering process was performed to grow a titanium tungsten (TiW, Ti:W=12.5%:87.5%) alloy film (thickness: 4.5 nm) as the electron-capturing layer, and then, a tantalum (Ta) metal film (thickness: 4.5 nm) is grown as the barrier layer. Except for the step of forming the barrier layer and the electron-capturing layer, the material and steps in forming all other layers are the same as those of the Comparative Example 1, and the details will not be repeated here.

Figure 4A:
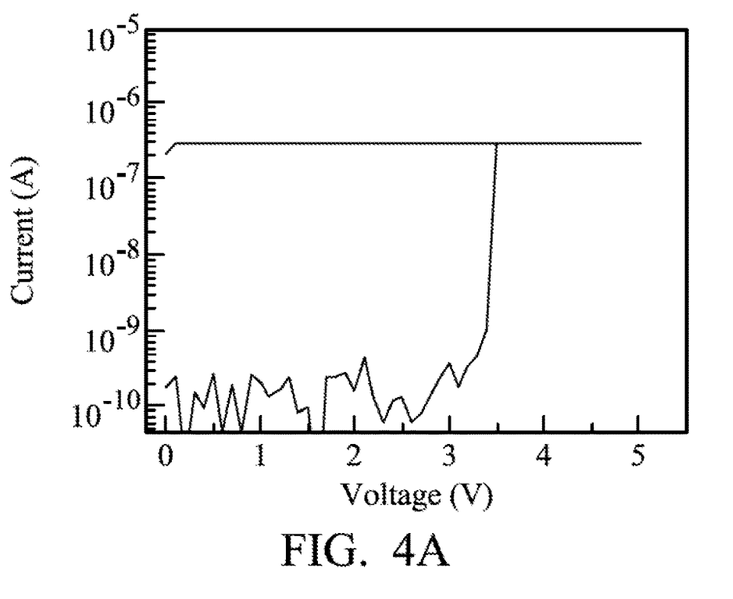
FIGS. 4A-4C show the experimental results of the forming voltages of the conductive-bridging random access memories in Comparative Example 1, Comparative Example 2, and Example 1.
Figure 4B:
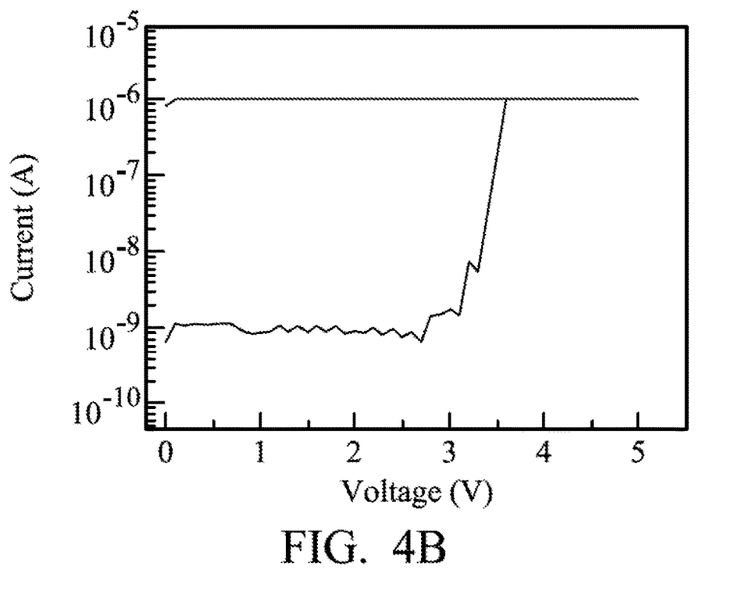
Figure 4C:
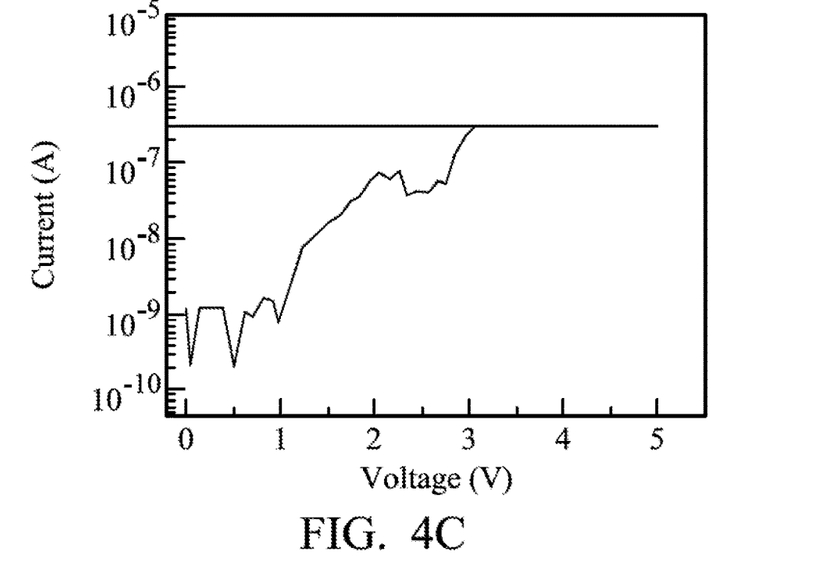

FIGS. 4A-4C show the experimental results of the forming voltages of the conductive-bridging random access memories in Comparative Example 1, Comparative Examples 2, and Example 1. The forming process of the low-electrical-resistance state of the conductive-bridging random access memory may be understood through FIGS. 4A-4C.

The forming process was performed by applying a positive voltage to the top electrode layer (i.e., titanium tungsten tellurium alloy film) and electrically grounding the bottom electrode layer (i.e., titanium nitride film). During the forming process, the current passing through the CBRAM increases as the applied voltage increases. When the current increases to the limit current value, the corresponding applied voltage value is defined as the forming voltage. When the applied voltage is greater than the forming voltage, the electrical resistance of the CBRAM is switched from the initial high-electrical-resistance state to the low-electrical-resistance state. As shown in FIGS. 4A-4C, the forming voltage of Comparative Example 1, Comparative Example 2, and Example 1 is about 3.5 V, about 3.5 V, and about 3.1 V, respectively.

Figure 5:
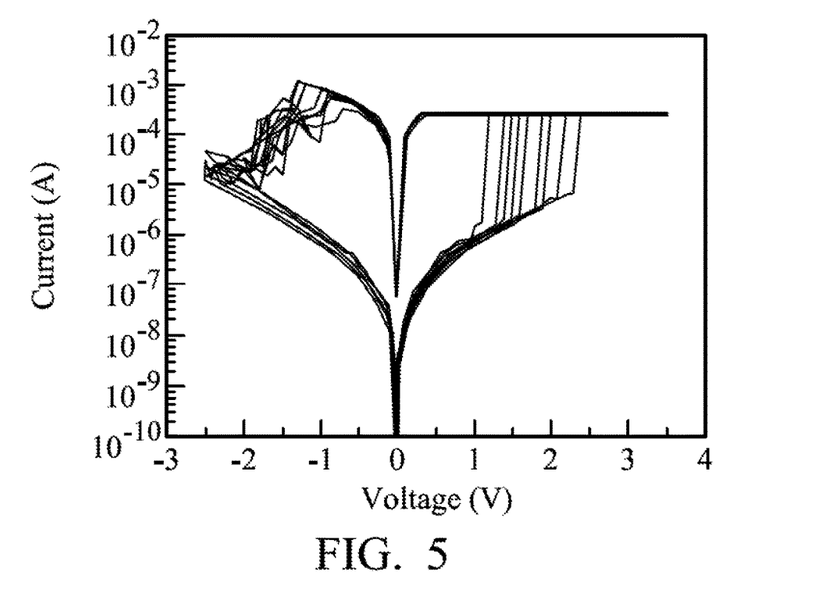
FIG. 5 shows voltage-current curves of the electrical resistance state switching of the conductive-bridging random access memory in Example 1.

FIG. 5 shows voltage-current curves of the electrical resistance state switching of the CBRAM in Example 1. The switching process between the high-electrical-resistance state and the low-electrical-resistance state of the CBRAM may be understood through FIG. 5.

The switching process was performed by applying a specific positive voltage to the top electrode layer (i.e., titanium tungsten tellurium alloy film), and the applied voltage was gradually increased from 0 V to the specific positive voltage. Then, the applied voltage was gradually decreased from the specific positive voltage to 0 V, and a cycle of switching process from the high-electrical-resistance state to the low-electrical-resistance state was completed. Next, a specific negative voltage was applied to the top electrode layer, and the applied voltage was gradually decreased from 0 V to the specific positive voltage. Then, the applied voltage was gradually increased from the specific negative voltage to 0 V, and a cycle of switching process from the low-electrical-resistance state to the high-electrical-resistance state was completed.

In FIG. 5, the specific positive voltage and the specific negative voltage used in the switching process were 3.5 V and −2.5 V, respectively. Furthermore, FIG. 5 shows the overlapped results of several cycles of the switching process.

Figure 6A:
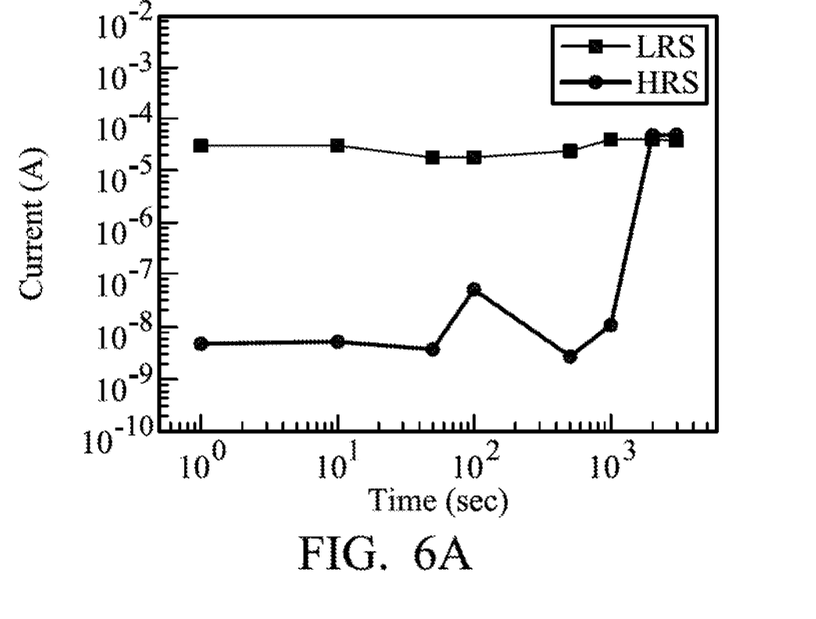
FIGS. 6A-6C show the experimental results of high-temperature data retention ability of the conductive-bridging random access memories in Comparative Example 1, Comparative Example 2 and Example 1.
Figure 6B:
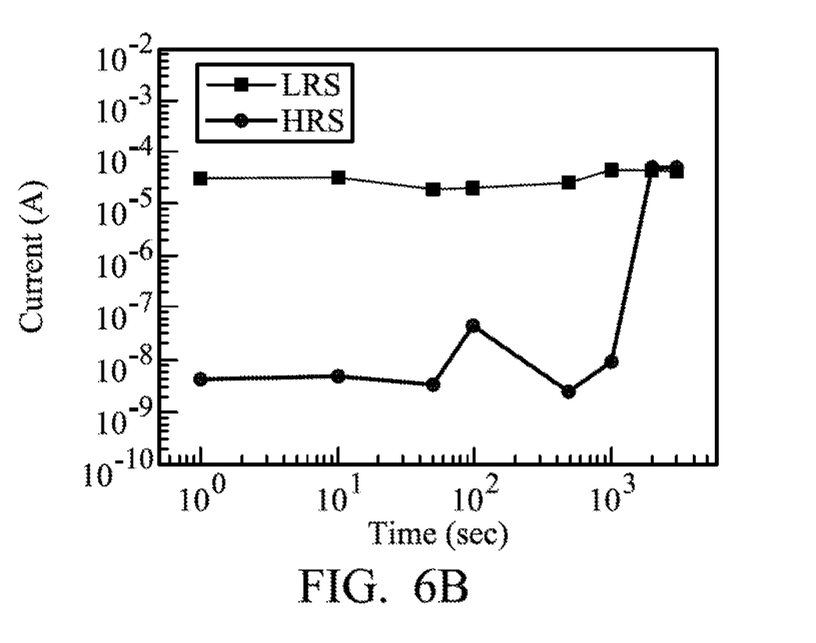
Figure 6C:
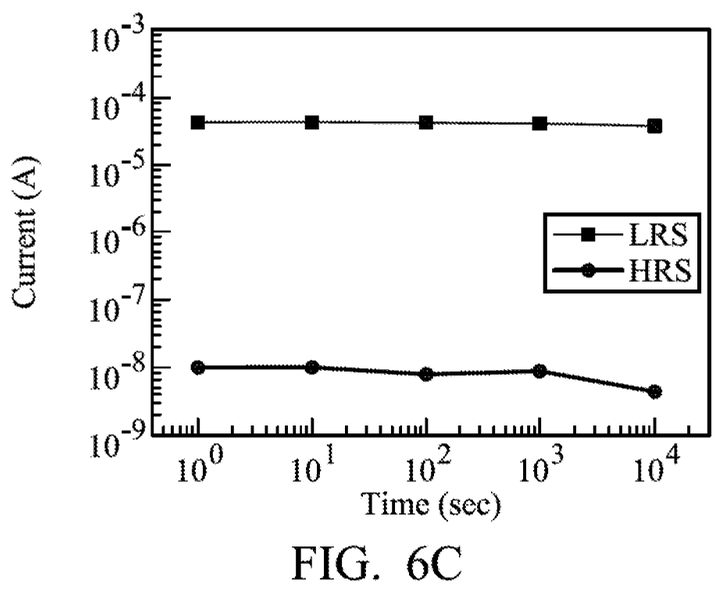

FIGS. 6A-6C show the experimental results of high-temperature data retention ability of the CBRAMs in Comparative Example 1, Comparative Example 2 and Example 1. The experimental results of high-temperature data retention ability of Comparative Example 1, Comparative Example 2 and Example 1 are also shown in Table 1.

The operation of the data retention ability test is illustrated in the following description. The conductive-bridging random access memory was switched to high-electrical-resistance state at room temperature or the low-electrical-resistance state. Then, the temperature of the environment was raised to a specific high-temperature (For example, 225° C.), and the current value at a read voltage being −0.3 V was read out at regular intervals. The electrical resistance value of the high-electrical-resistance state or the low-electrical-resistance state was calculated by the read current value.

FIG. 6A shows the experimental results of the data retention ability test at a temperature of 225° C. Referring to Table 1 and FIG. 6A, the CBRAM of Comparative Example 1 maintained the high-electrical-resistance state for about 1000 seconds. However, the high-electrical-resistance state of the device became the low-electrical-resistance state after 1000 seconds. Therefore, the memory device failed.

FIG. 6B shows the experimental results of the data retention ability test at a temperature of 225° C. Referring to Table 1 and FIG. 6B, the CBRAM of Comparative Example 2 maintained the high-electrical-resistance state for about 1000 seconds. However, the high-electrical-resistance state of the device became the low-electrical-resistance state after 1000 seconds. Therefore, the memory device failed.

FIG. 6C shows the experimental results of the data retention ability test at a temperature of 225° C. Referring to Table 1 and FIG. 6C, the CBRAM of Example 1 correctly maintained the high-electrical-resistance state for more than about 10000 seconds at the temperature of 225° C. Accordingly, the stability and endurance of the CBRAM at high-temperature operations can be significantly improved because the dual-layer structure which has the electron-capturing layer and the barrier layer is formed between the electrical resistance switching layer and the ion source layer.

TABLE 1

|  | Comparative Example 1 | Comparative Example 2 | Example 1 |
| --- | --- | --- | --- |
| barrier layer | TiW alloy film (9 nm) | none | TiW alloy film (4.5 nm) |
| electron-capturing layer | none | Ta metal film (9 nm) | Ta metal film (4.5 nm) |
| test temperature | 225° C. | 225° C. | 225° C. |
| endurance of the memory device at high temperature | The memory device failed after being placed in a temperature of 225° C. for 1000 seconds. | The memory device failed after being placed in a temperature of 225° C. for 1000 seconds. | The memory device can correctly operate after being placed in a temperature of 225° C. for more than 10000 seconds. |

As described above, in the CBRAM of this disclosure, the dual-layer structure which has the electron-capturing layer and the barrier layer is formed between the electrical resistance switching layer and the ion source layer. The barrier layer may decrease the amount of the ion source element moving into the electrical resistance switching layer during the forming process. Furthermore, the electron-capturing layer may decrease the amount of the metal atoms which are formed by reducing the metal ions made from the ion source element. Therefore, the stability and endurance of the device at high-temperature operations are significantly improved.

In addition, the method for fabricating the CBRAM of this disclosure may be easily incorporated to existing fabricating processes of the CBRAM without additionally replacing or modifying the production equipment. As a result, the performance stability and the product lifetime of the CBRAM may be improved without increasing the process complexity and manufacturing cost.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A conductive-bridging random access memory, comprising:
   a bottom electrode layer formed on a semiconductor substrate;
   an electrical resistance switching layer formed on the bottom electrode layer;
   an electron-capturing layer formed on the electrical resistance switching layer, wherein the electron-capturing layer comprises an electron-capturing material, and an electron affinity of the electron-capturing material is at least 60 KJ/mole;
   a barrier layer formed on the electron-capturing layer;
   an ion source layer formed on the barrier layer; and
   a top electrode layer formed on the ion source layer.

2. The conductive-bridging random access memory as claimed in claim 1, wherein the electron affinity of the electron-capturing material is not greater than 130 KJ/mole.

3. The conductive-bridging random access memory as claimed in claim 1, wherein the electron-capturing layer is in direct contact with the electrical resistance switching layer.

4. The conductive-bridging random access memory as claimed in claim 1, wherein the electron-capturing layer is made of a first amorphous material, and the first amorphous material comprises a metal, an alloy, a metal doped with nitrogen, oxygen sulfur or silicon, an alloy doped with nitrogen, oxygen sulfur or silicon, or a combination thereof.

5. The conductive-bridging random access memory as claimed in claim 4, wherein the barrier layer is made of a second amorphous material, and the second amorphous material is different from the first amorphous material, and the second amorphous material comprises a metal, a metal oxide, a metal silicide, a metal nitride, a metal oxynitride, a metal silicide nitride, or a combination thereof.

6. The conductive-bridging random access memory as claimed in claim 1, wherein a total thickness of the electron-capturing layer and the barrier layer is in a range of 5-20 nm.

7. The conductive-bridging random access memory as claimed in claim 6, wherein a thickness of the electron-capturing layer is in a range of 1-10 nm.

8. The conductive-bridging random access memory as claimed in claim 1, wherein the ion source layer comprises:
   an ion source element comprising copper, silver, gold, tellurium, or alloys thereof; and
   a conductive element, wherein the conductive element is not the ion source element.

9. The conductive-bridging random access memory as claimed in claim 8, wherein a content of the ion source element in the ion source layer is in a range of 10%-90%.

10. A method for fabricating a resistive random-access memory structure, comprising:
    forming a bottom electrode layer on the semiconductor substrate;
    forming an electrical resistance switching layer on the bottom electrode layer;
    forming an electron-capturing layer on the electrical resistance switching layer, wherein the electron-capturing layer comprises an electron-capturing material, and an electron affinity of the electron-capturing material is at least 60 KJ/mole;
    forming a barrier layer on the electron-capturing layer;
    forming an ion source layer on the barrier layer; and
    forming a top electrode layer on the ion source layer.

11. The method for fabricating the resistive random-access memory structure as claimed in claim 10, wherein the ion source layer comprises:
    an ion source element comprising copper, silver, gold, tellurium, or alloys thereof; and
    a conductive element, wherein the conductive element is not the ion source element.

12. The method for fabricating the resistive random-access memory structure as claimed in claim 11, wherein forming the ion source layer comprises:
    depositing the conductive element to form a conductive element layer on the barrier layer;
    depositing the ion source element on the conductive element layer; and
    performing an annealing process to form the ion source layer made of the ion source element and the conductive element, wherein a content of the ion source element in the ion source layer is in a range of 10%-90%.

13. The method for fabricating the resistive random-access memory structure as claimed in claim 11, wherein forming the ion source layer comprises depositing the conductive element and the ion source element on the barrier layer in a depositing process, wherein a content of the ion source element in the ion source layer is in a range of 10%-70%.

14. The method for fabricating the resistive random-access memory structure as claimed in claim 10, wherein the electron affinity of the electron-capturing material is not greater than 130 KJ/mole.

15. The method for fabricating the resistive random-access memory structure as claimed in claim 10, wherein the electron-capturing layer is in direct contact with the electrical resistance switching layer.

16. The method for fabricating the resistive random-access memory structure as claimed in claim 10, wherein the electron-capturing layer is made of a first amorphous material, and the first amorphous material comprises a metal, an alloy, a metal doped with nitrogen, oxygen sulfur or silicon, an alloy doped with nitrogen, oxygen sulfur or silicon, or a combination thereof.

17. The method for fabricating the resistive random-access memory structure as claimed in claim 16, wherein the barrier layer is made of a second amorphous material, and the second amorphous material is different from the first amorphous material, and the second amorphous material comprises a metal, a metal oxide, a metal silicide, a metal nitride, a metal oxynitride, a metal silicide nitride, or a combination thereof.

* * * * *